United States Patent
Cahill et al.

[11] Patent Number: 6,066,967
[45] Date of Patent: May 23, 2000

[54] PHASE-COHERENT FREQUENCY SYNTHESIS WITH A DDS CIRCUIT

[75] Inventors: James P. Cahill, Alexandria; William M. Markowitz, Arlington, both of Va.

[73] Assignee: Sensytech, Inc., Newington, Va.

[21] Appl. No.: 09/019,551

[22] Filed: Feb. 6, 1998

Related U.S. Application Data

[60] Provisional application No. 60/036,942, Feb. 7, 1997.

[51] Int. Cl.$^7$ .............................. G06F 1/02; H04L 27/20
[52] U.S. Cl. ..................... 327/107; 327/105; 327/106; 708/271; 708/276
[58] Field of Search ................. 327/105, 115, 327/116, 106, 107, 141; 708/271, 276

[56] References Cited

U.S. PATENT DOCUMENTS

| | | | |
|---|---|---|---|
| 4,951,004 | 8/1990 | Sheffer et al. | 327/105 |
| 4,998,072 | 3/1991 | Sheffer | 327/106 |
| 5,063,354 | 11/1991 | Lauper et al. | 327/107 |
| 5,084,681 | 1/1992 | Kovalick et al. | 327/106 |
| 5,144,571 | 9/1992 | Thong | 327/106 |
| 5,399,984 | 3/1995 | Frank | 327/107 |
| 5,424,664 | 6/1995 | Phillips | 327/106 |
| 5,467,294 | 11/1995 | Hu et al. | 327/106 |
| 5,519,343 | 5/1996 | Britz | 327/106 |
| 5,705,945 | 1/1998 | Wee | 327/107 |

*Primary Examiner*—Dinh T. Le
*Attorney, Agent, or Firm*—Oblon, Spivak, McClelland, Maier & Neustadt, P.C.

[57] ABSTRACT

An improved circuit and technique for obtaining phase-coherent synthesis using a direct digital synthesizer (DDS). In the phase-coherent frequency synthesis device of the invention, a computational engine constructed from a large programmable gate array, a digital signal processing microprocessor, or a number of discrete digital logic blocks generates information sent to the DDS for generating an output frequency, $f_{out}$, which is in phase with all previous outputs of the device at the same frequency.

4 Claims, 5 Drawing Sheets

PHASE COHERENT DDS-SYSTEM TIMING DIAGRAM

SYSTEM CLOCK $f_{sys}$

FIG. 6A

$f_r = \dfrac{f_{sys}}{N}$, for N=4

FIG. 6B

FRC VALUE: m-1, m, m+1, m+1

FIG. 6C

Valid FRC

FIG. 6D

FREQUENCY CODE 'p', $p=(2^P f_{out}/f_{sys})$ — 1 VALID FREQUENCY CODE

FIG. 6E

FREQUENCY CHANGE STROBE — 2

FIG. 6F

LATCH 'm'

FIG. 6G

LOAD PIR #1 ← 'p'    3

FIG. 6H

MULTIPLY 'm' X 'p': $k=(mpN)\,MODULO\,2^P$    4

FIG. 6I

LOAD PIR #2 ← 'k'    5

FIG. 6J

LOAD ACCUMULATOR FROM PIR #2
ACC ← 'k'    6

FIG. 6K

ACCUMULATE FROM PIR #1
ACC ← 'p'    7

FIG. 6L

PHASE-COHERENT FREQUENCY SYNTHESIS WITH A DDS CIRCUIT

This application claims benefit of provisional application Ser. No. 60/036,942 filed Feb. 7, 1997.

BACKGROUND OF THE INVENTION

1. Field of the Invention

The present invention is directed to devices and methods for generating phase-coherent frequencies.

2. Discussion of the Background

Useful synthesizers are able to generate a large number of frequencies and can switch rapidly between frequencies. Owing to their low cost, ease of control, high switching speed, and ability to generate millions of frequencies, direct digital synthesizers (DDSs) are increasingly popular. DDS integrated circuits (ICs) are available which can generate signals up to approximately 40 MHz with a resolution of less than 0.1 Hz. Unfortunately, the standard DDS method is inherently non-phase coherent.

For a synthesizer to be phase coherent, each instance of a particular frequency must be in phase with every previous instance of that same frequency. In other words, if the synthesizer switches from a frequency $f_A$ to a frequency $f_B$, and then back to $f_A$, the second occurrence of $f_A$ would have the same phase that the first signal would have had if it had not been interrupted. Phase coherence is required in devices, for example, which simulate scanning radars. FIG. 1 illustrates the phases for $f_A$ and $f_B$ when switching from $f_A$ to $f_B$ and back to $f_A$ in a non-phase-coherent DDS, and FIG. 2 illustrates the same switching in a phase-coherent DDS.

A typical DDS circuit, as shown in FIG. 3, comprises a P-bit phase step register 1, a phase accumulator 2, and a read-only memory (ROM) 3 containing a sine lookup table. In addition, an external digital-to-analog converter (DAC) (not shown) and a low-pass filter (LPF) (not shown) are added for generating sinusoidal signals. See, e.g., Vadim Manassewitsch, *Frequency Synthesizers, Theory and Design* (New York: John Wiley & Sons, 1987), pp. 37–43. The components which are most important for this discussion are the phase step register 1 and the phase accumulator 2. The phase accumulator 2 can simply be a digital adder circuit, the output of which is fed back to the input and added to the contents of the phase step register 1.

With each cycle of the system clock, the phase accumulator's 2 output advances by the contents of the phase step register 1. The sine lookup table contained in the ROM 3 converts the digital representation of phase to a digital representation of the amplitude of a sine wave. This digital signal is converted to an analog one by the DAC, and discontinuities in the waveform output are filtered by the LPF.

Since frequency is the rate of change of phase, the frequency generated is $$f_{out} = \frac{\Delta \Phi}{T_{sys}}, \qquad (1),$$

where $f_{out}$ is the DDS output frequency, $\Delta \Phi$ is phase step of the DDS accumulator, and $T_{sys}$ is the system clock period. To change frequencies, it is only necessary to change the contents of the phase step register. When a frequency change occurs, the phase of the new frequency is one phase step greater than the old. Thus, the standard DDS circuit is inherently phase continuous, which precludes obtaining the desired phase-coherent behavior.

A known method for coherent DDS is shown in FIG. 4. A DDS circuit can be made phase coherent if, after each frequency change, the phase accumulator is reset to zero on the rising edge of a reset clock, which has a frequency $$f_r = \frac{f_{sys}}{N}, \qquad (2),$$

where $f_{sys}=1/T_{sys}$ and N is the integer divisor associated with the divide-by-N circuit 4 in FIG. 4. The frequency of the output of the DDS 5 is set to be an integer multiple of the reset clock, $$f_{out}=n \times f_r, \qquad (3),$$

where n is an integer. All frequencies are thus tied to the reset clock, and each rising edge of the reset clock corresponds to a zero-phase point of the output. The DDS 5 in FIG. 4 includes elements 1, 2, and 3, as configured in FIG. 3.

The problem with the scheme shown in FIG. 4 and described above is that it is impossible to simultaneously obtain low dwell time (i.e., the duration between the start of two valid signals at different frequencies) and good frequency resolution. The correct frequency and phase are achieved only after the rising edge of the reset clock. This means that the minimum frequency dwell time is one reset clock period, $T_r$. However, because the frequency must be an integer multiple of the reset clock, the frequency resolution is $1/T_r$. Note that the divide-by-N unit 4 permits improvement of the frequency resolution at the expense of increased dwell time.

SUMMARY OF THE INVENTION

It is an object of the present invention to produce a novel circuit for producing a phase-coherent DDS. In particular, the present invention provides a clock source connected to the DDS, a divide-by-N circuit, and a computational engine. There is also an M-bit free running counter connected to both the divide-by-N circuit and the computational engine, where the computational engine is also connected to a frequency code source. The output of the computational engine is connected to the DDS. The output of the DDS is connected to a digital-to-analog converter, and the digital-to-analog converter is also connected to a low-pass filter. The output of the low-pass filter is a signal representing the output frequency of the phase-coherent frequency synthesis device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 illustrates a timing chart for the preferred embodiment.

DESCRIPTION OF THE PREFERRED EMBODIMENT

Figure 1:
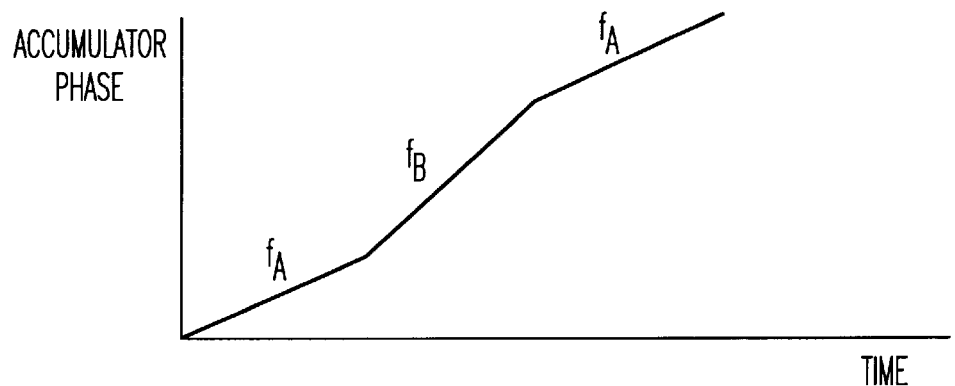
FIG. 1 illustrates the phases for two frequencies, $f_A$ and $f_B$, when switching from $f_A$ to $f_B$ and back to $f_A$ is performed by a non-phase-coherent DDS.
Figure 2:
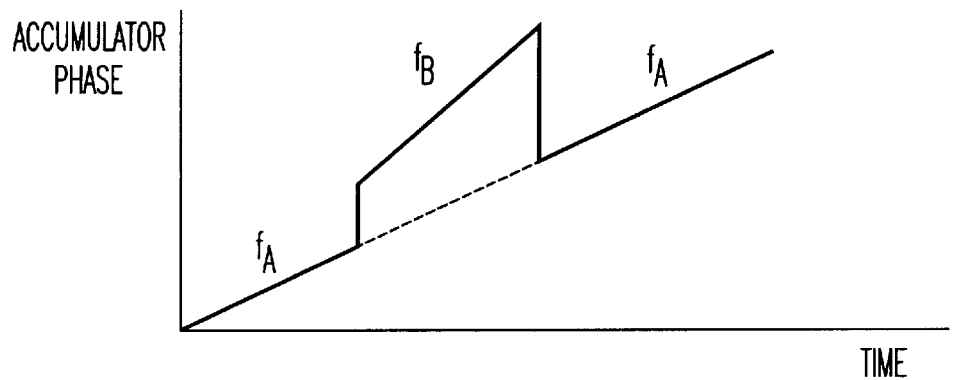
FIG. 2 illustrates the phases for the two frequencies in FIG. 1, when switching between them is performed by a phase-coherent DDS.
Figure 3:
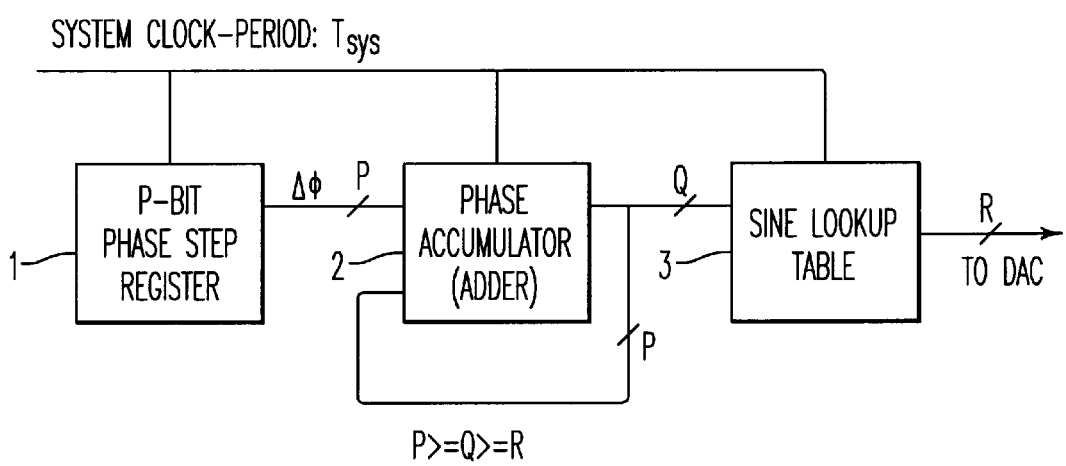
FIG. 3 illustrates a known non-phase-coherent DDS system.
Figure 4:
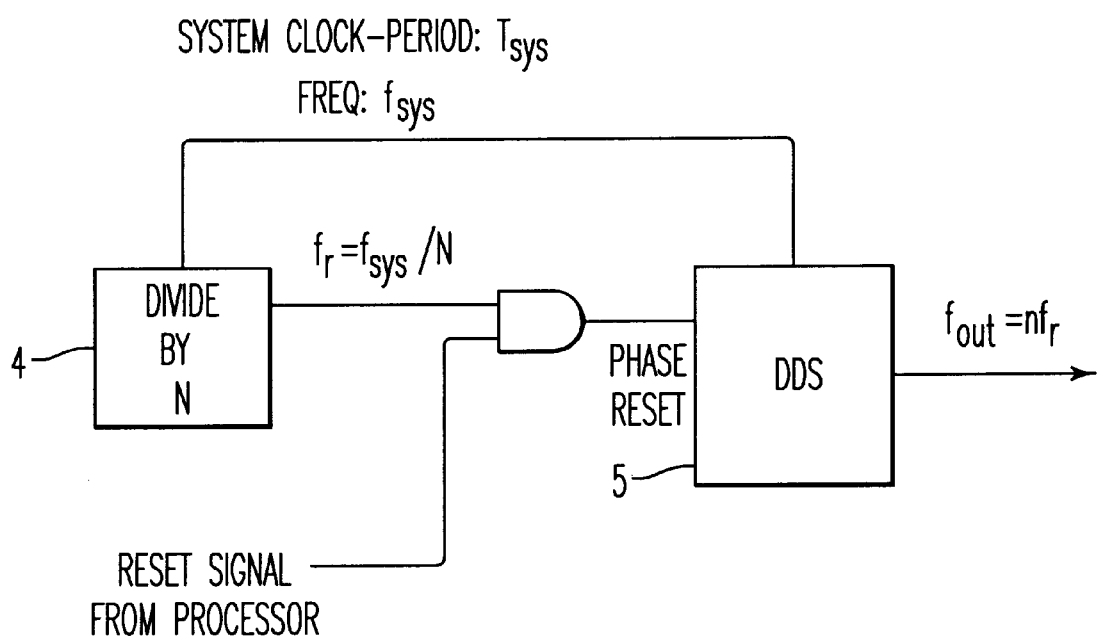
FIG. 4 illustrates a simple phase-coherent DDS.
Figure 5:
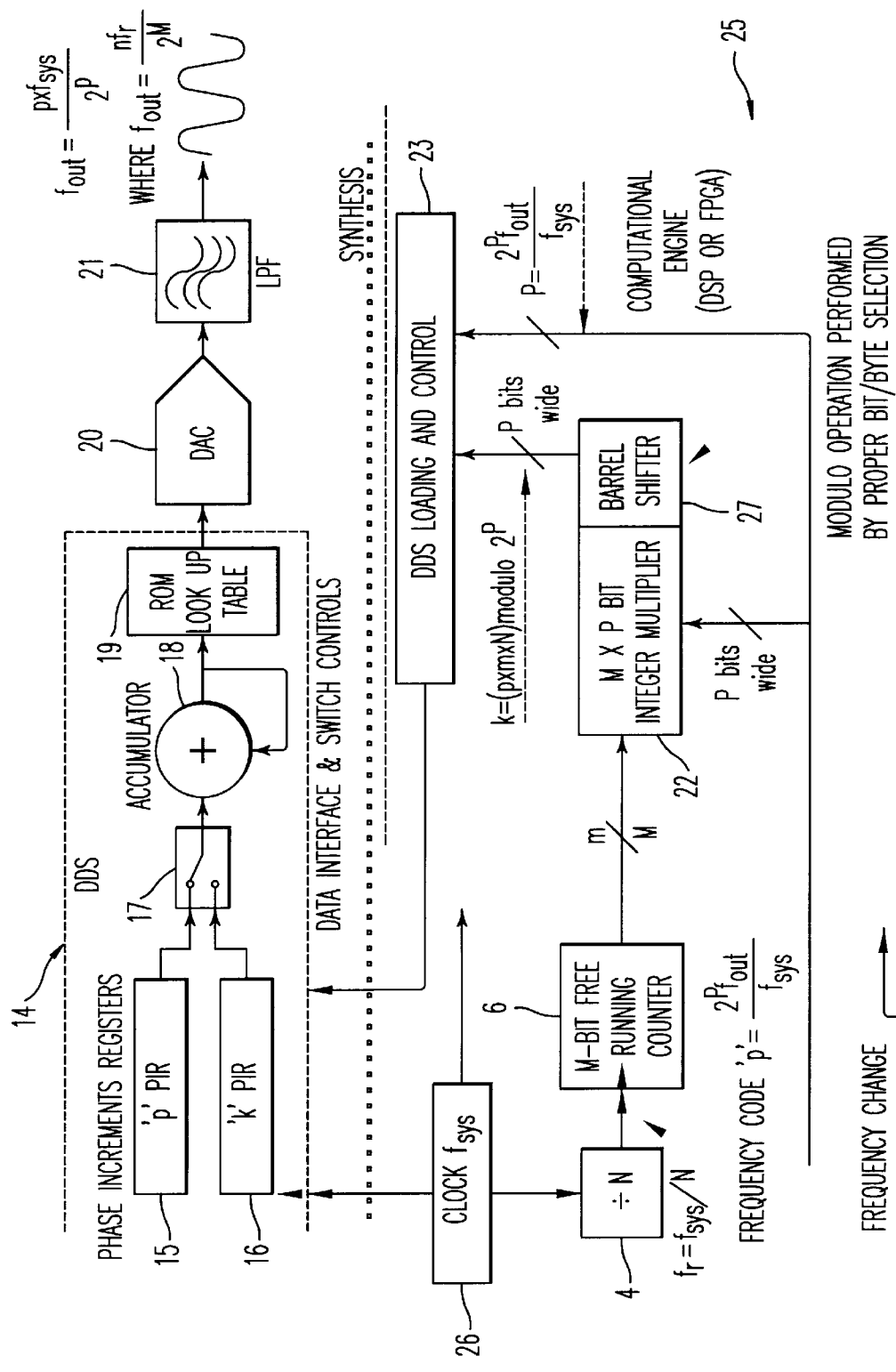
FIG. 5 illustrates the preferred embodiment of the present invention.

Referring now to the drawings, wherein like reference numerals designate identical or corresponding parts throughout the several views, a technique which overcomes the limitations in the conventional method is depicted in FIG. 5. The phase-coherent frequency synthesis device 30 has a reset clock frequency, $f_r$, which is generated by passing the output from the system clock 26 through the divide-by-N circuit 4. Each cycle of the $f_r$ clock increases the output value of the M-bit free running counter (FRC) 6 by one. In essence, the FRC 6 keeps track of the phase of a virtual $f_r/2^M$ clock, i.e., the output of the FRC 6, with each count representing a phase advance of $2\times\pi/(2^M)$. The phase accumulator 18 now can be reset on the rising edge of any $f_r$ clock pulse and the DDS 14 output phase adjusted based on the counter value. Under this scheme, the dwell time is still $1/f_r$, but the resolution is now $f_r/2^M$. Therefore, a high frequency reset clock can be used to obtain fast switching, while the good resolution can be obtained by choosing M to be large. The output frequency is limited to $n \times f_r/2^M$, where n is a positive integer.

In the case where the number of counter bits is less than the number of bits used in the DDS 14, the divide-by-N unit 4 allows an improvement in frequency resolution at the expense of increased dwell time. It is often desirable to use fewer counter bits to speed the calculations and the loading of the two phase increment registers (PIRs) 15, 16 in the DDS 14.

After a frequency change command has occurred, but before the new phase increment is presented to the accumulator 18, the desired starting phase of the new signal is found from the counter value. The phase of the virtual $f_r/2^M$ clock is $$2 \times \pi \times \frac{m}{2^M}, \quad (4),$$

where m is the current count of the FRC 6 when the frequency change is initiated. To bring the output phase in line with the phase of the virtual clock, the output phase must be set to $$2 \times \pi \times \frac{m}{2^M} \times \frac{f_{out}}{\frac{f_r}{2^M}} + \Phi_0 \text{ or } 2 \times \pi \times m \times \frac{f_{out}}{f_r} + \Phi_0 \quad (5),$$

where $\Phi_0$ is an arbitrary phase offset which is fixed for a given frequency. This computation is carried out by the computational engine 25, and the result is used to set the starting phase of the DDS 14.

The precise configuration and timing of the phase calculator and the circuits to produce the phase adjustment and frequency change command signals depend upon the particular DDS configuration used. In the preferred embodiment, the DDS 14 phase can be set by employing a second PIR 16 which is loaded with the desired phase setting given by equation (5). The accumulator value is set to zero and then the contents of the second PIR 16 are added to the accumulator 18 for one system clock cycle. The one-time addition using the second PIR 16 occurs a fixed number of cycles after a frequency change is initiated; this is accomplished by toggling a switch 17 from the first PIR 15 to the second PIR 16 for the one clock cycle. Thereafter, the accumulator is incremented by adding the contents of the first PIR 15. If the DDS operates in this manner and the first PIR 15 uses P bits to represent $2 \times \pi$ radians, then the second PIR 16 is loaded with the step value $$2^P \times FRAC\left(m \times \frac{f_{out}}{f_r}\right), \quad (6),$$

where $FRAC(\cdot)$ is an operator that returns the fractional value of the number within the parentheses, and the phase of the accumulator 18 is advanced by this value one time. Equation (6) can be cast in a form more amenable to binary arithmetic.

It is not strictly necessary that the phase zero point of the output signal be aligned with the zero phase point of the virtual $f_r/2^M$ clock. It simply is necessary to align the output zero phase point with the same phase point of the $f_r/2^M$ clock every time. Some time difference between when the counter value is obtained from the phase calculator and when the accumulator is reset can be tolerated provided that the time difference is consistent. In practice, to minimize the down time between valid frequencies the accumulator is not reset until the phase calculations had been completed and the phase step values are loaded into the DDS 14. It is possible to avoid explicitly resetting the accumulator to zero if the accumulator can be loaded with a starting value. In this case, the calculated phase value is loaded into the accumulator when a frequency change is made.

The preferred embodiment of the invention has several circuit subsections: a clock source 26 for generating the system frequency $f_{sys}$, a divide-by-N circuit 4, a FRC 6, a computational engine 25, a DAC 20, an LPF 21, and a DDS 14. In the phase-coherent frequency synthesis device 30, the clock source 26, which generates $f_{sys}$, is connected to the DDS 14, the divide-by-N circuit 4, and the computational engine 25. The output of the divide-by-N circuit 4, $f_r$, is connected to the FRC 6. The output of the FRC 6 is connected to the multiplier 22, whose output passes through the barrel shifter 27. Both the output of the barrel shifter 27 and the value p are inputs to the DDS loading and control circuit 23. The output of the DDS loading and control circuit 23 is connected to the DDS 14. The output of the DDS 14 is passed through the DAC 20, whose output is passed through the LPF 21 to yield $f_{out}$. Within the DDS 14, one of the two PIRs 15,16 is connected via the switch 17 to the phase accumulator 18. The output of the phase accumulator is connected to the ROM look-up table 19, which produces the value for the sine wave, which is the output of the DDS 14.

Frequency division should be provided by the divide-by-N circuit 4 as required for these components based upon restrictions imposed by circuit timing and data bus width, provided that the time required for the computational engine 25 to perform its tasks remains constant and the computational engine 25 compensates for this division. In other words, producing $f_r$ from $f_{sys}$ allows for restrictions imposed by circuit timing and data bus width. In the case where the number of bits, M, in the FRC 6 is less than the number of bits, P, in the accumulator 18, dividing the system clock by N (in this case $N=2^i$, where $i=0,1,2,\ldots$) to obtain the $f_r$ clock improves the resolution by a factor of N. One advantage of using fewer counter bits (M) when a bus to load the DDS 14 is less than P bits wide is that fewer cycles are required to load the first and the second PIRs 15, 16, and, therefore, the dwell time is reduced.

The FRC 6 is used to provide instantaneous indices for the phases of all frequencies.

The computational engine 25 has several major components: a multiplier 22, a barrel shifter 27, and a DDS loading and control circuit 23. The computational engine 25 reads the values of p and m, and the computational engine 25 is connected to the DDS 14. The value p is the phase increment value (or frequency code) loaded into the DDS 14, and the value m is read from the FRC 6. The value p is determined by $$p = 2^P \times \frac{f_{out}}{f_{sys}}, \qquad (7),$$

where $$f_{out} = n \times \frac{f_r}{2^M} \qquad (8),$$

and where n is a positive integer. The multiplier 22 is binary device capable of performing an integer multiplication of two words, one P bits long and the other M bits long. It is preferable that this unit perform its function in one clock cycle. Floating-point multiplication may not be used as the least significant bits of the product is be required for one-time phase adjustment. The multiplier and barrel shifter perform the following operation: $k=(p \times N \times m) \text{modulo} 2^P$. The barrel shifter 27 is a binary device which performs the multiplication by N and the modulo operation to select the P least significant bits from the product $p \times N \times m$. It is preferable the barrel shifter 27 perform its function in one clock cycle.

The DDS loading and control circuit 23 is used to load p into the first PIR 15, which sets the output frequency of the DDS, and the DDS loading and control circuit 23 also loads the barrel shifter 27 output into the second PIR 16. The specifics of this portion of the computational engine 25 will vary depending on the DDS specifics, and the size of M and P. However, it is imperative that the time required for the computational engine 25 to perform all its functions must remain constant for all frequency change and phase adjust operations.

The DDS component 14 must have a minimum of a first and a second PIRs 15, 16 which can provide a phase increment value to an accumulator 18 or another means for loading the accumulator 18 with a starting phase. The accumulator 18 must have the capability for direct non-accumulated loading of a PIR value, or the capability to be cleared. This accumulator register provides the address for a ROM 19 containing the digitized samples of one period of a sine wave. The addressed value from the ROM 19 is converted to an analog signal by the DAC 20 and passed through the LPF 21.

A control is required to determine which PIR provides the increment value to the accumulator for a given $f_{sys}$ clock interval. The first PIR 15 contains the phase increment value p necessary for the production of the desired frequency, and the second PIR 16 contains the phase increment value necessary for the one-time phase offset.

The operation of the entire phase-coherent frequency synthesis device 30 is described by the steps listed below:

Step 1. Present new frequency code p, which is P bits long, to the data port of the computational engine 25.

Step 2. Activate the STROBE line.

Step 3. At the next valid $f_r$ clock edge
 a) latch the current value of the FRC 6, m, which is M bits long;
 b) load the p value into the first PIR 15.

Step 4. Perform the multiplication step $p \times N \times m$. Perform a modulo operation to the product by taking only P least significant bits.

Step 5. Load the result of the modulo operation performed in step 4 (i.e., the value k) into the second PIR 16.

Step 6. Load—do not accumulate—the value k in the second PIR 16 into the accumulator 18. The value k establishes the starting phase.

Step 7. Accumulate the value of the first PIR 15 with each new clock cycle. This provides the desired output frequency selected by the value p.

It is noted that m and p may be shifted, i e., multiplied or divided by powers of 2, as needed to accommodate various sized data buses that impose limitations on the sizes of M and P. A divide-by-N reference to the FRC 6 is required to facilitate this bus width adjustment. If the accumulator does not have the capability to be directly loaded with a starting value, then two additional steps are required for Step 6:

6.a. clear the DDS accumulator 18, or accumulate the value of 0; and
 6.b. accumulate for only one clock cycle, the value in the second PIR 16.

It is critical that the time between Step 3 and Step 7 is constant for all frequency change operations; variations in this time induce significant phase errors. The actual timing and duration of each step vary depending on the hardware components chosen for the implementation of this invention.

The computational engine 25, DDS 14, FRC 6, and divide-by-N circuit 4 may take the form of a large programmable gate array (FPGA) or a digital signal processing (DSP) microprocessor or a number of discrete digital logic blocks or software or a combination thereof.

Figure 7:
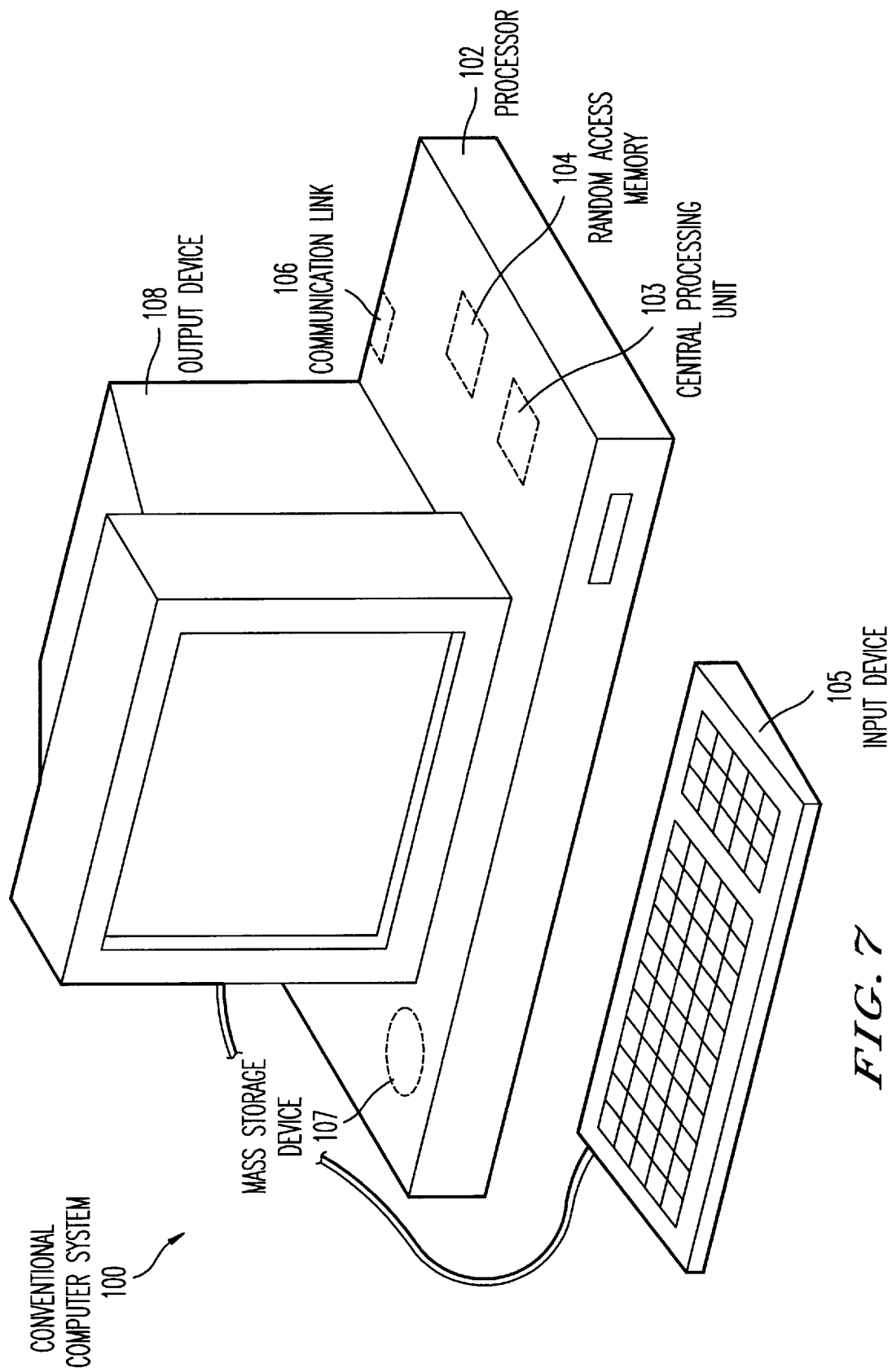
FIG. 7 illustrates a computer implementation of the preferred embodiment.

FIG. 7 illustrates a computer implementation of the computational engine 25, system clock 26, DDS 14, FRC 6, and divide-by-N circuit 4. A conventional computer system 100 has a processor 102 and a communication link 106 (e.g., an SCSI bus). The processor 102 can be any general purpose computer system, and specifically includes at least a central processing unit 103 (CPU), random access memory 104 (RAM), a mass storage device 107 (e.g., a hard disk or a magneto-optical disk), an input device 105 (e.g., a mouse or a keyboard), and an output device 108 (e.g., a monitor). Further, the processor 102 includes any of the available commercial operating systems (e.g., UNIX, Windows 95, Windows NT, OS/2, or Linux) and any other software required to process frequency synthesis data.

Obviously, numerous modifications and variations of the present invention are possible in light of the above teachings. It is, therefore, to be understood that within the scope of the appended claims, the invention may be practiced otherwise than as specifically described herein.

What is claimed as new and desired to be secured by Letters Patent of the United States is:

1. A phase-coherent frequency synthesis device comprising:
 a clock source;
 a divide-by-N circuit having a first input and a first output, wherein N is an integer and wherein said first input is connected to said clock source;
 an M-bit free running counter having a second input and a second output, wherein M is an integer and wherein said second input is connected to said first output;

a processor having a third input, a fourth input, a fifth input, a sixth input, and a third output, wherein a frequency change signal is connected to said third input, wherein said second output is connected to said fourth input, wherein said clock source is connected to said fifth input, and wherein a frequency code is connected to said sixth input;

a direct digital synthesizer having a seventh input, an eighth input, and a fourth output, wherein said system clock is connected to said seventh input and said third output is connected to said eighth input;

a digital-to-analog converter having a ninth input and a fifth output, wherein said fourth output is connected to said ninth input; and a low-pass filter having an tenth input and a sixth output, wherein said fifth output is connected to said tenth input, and wherein said sixth output is a signal representing an output frequency of said phase-coherent frequency synthesis device.

2. A method for synthesizing a phase-coherent frequency comprising the steps of:

receiving a frequency code p, wherein said frequency code is P bits long, wherein $$p = 2^P \times \frac{f_{out}}{f_{sys}},$$

and wherein $f_{out}$ is an output frequency and $f_{sys}$ is a system clock frequency;

initiating a frequency change operation upon having received said frequency code p;

latching a current value m of an M-bit counter at a next valid edge of a clock $f_r$;

loading said frequency code p into a first phase increment register;

performing a multiplication of said value m and said value p and a value N, said multiplication yielding a result p×N×m, wherein said value N is an integer;

performing a modulo operation on said product p×N×m by taking only p least significant bits of said product p×N×m, said modulo operation producing a value k;

loading said value k into a second phase increment register;

loading said value k into an accumulator from said second phase increment register to provide for phase adjustment;

accumulating said value p of said first phase increment register with a new clock cycle to produce a digital output frequency selected by said frequency code p;

converting said digital output frequency to an analog output frequency; and filtering said analog output frequency to produce a filtered analog output frequency.

3. A phase-coherent frequency synthesis device comprising:

means for providing a clock signal;

means for dividing by N having a first input and a first output, wherein N is an integer and wherein said first input is connected to said clock means;

means for counting from 0 to ($2^M$–1) in steps of 1, said counting means having a second input and a second output, wherein M is an integer and wherein said second input is connected to said first output;

means for calculating having a third input, a fourth input, a fifth input, a sixth input, and a third output, wherein a frequency change signal is connected to said third input, wherein said second output is connected to said fourth input, wherein said clock means is connected to said fifth input, and wherein a frequency code is connected to said sixth input;

means for direct digital synthesizing having a seventh input, an eighth input, and a fourth output, wherein said clock means is connected to said seventh input and said third output is connected to said eighth input;

means for converting from a digital signal to an analog signal, said converting means having a ninth input and a fifth output, wherein said fourth output is connected to said ninth input; and means for low-pass filtering, said filtering means having an tenth input and a sixth output, wherein said fifth output is connected to said tenth input, and wherein said sixth output is a signal representing an output frequency of said phase-coherent frequency synthesis device.

4. A computer program product including a computer readable medium tangibly embodying a set of instructions for controlling a central processing unit to perform a computer-implemented method comprising the steps of:

receiving a frequency code p, wherein said frequency code is P bits long, wherein $$p = 2^P \times \frac{f_{out}}{f_{sys}},$$

and wherein $f_{out}$ is an output frequency and $f_{sys}$ is a system clock frequency;

initiating a frequency change operation upon having received said frequency code p;

reading a current value m of an M-bit counter latched at a next valid edge of a clock $f_r$;

loading said frequency code p into a first phase increment register;

performing a multiplication of said value m and said value p and a value N, said multiplication yielding a result p×N×m, wherein said value N is an integer;

performing a modulo operation on said product p×N×m by taking only P least significant bits of said product p×N×m, said modulo operation producing a value k;

loading said value k into a second phase increment register;

loading said value k into an accumulator from said second phase increment register to provide for phase adjustment; and accumulating said value p of said first phase increment register with a new clock cycle to produce a digital output frequency selected by said frequency code p.

* * * * *